(12) United States Patent
Denham

(10) Patent No.: US 8,466,816 B2
(45) Date of Patent: Jun. 18, 2013

(54) METHOD AND APPARATUS FOR SERIALIZING BITS

(75) Inventor: Martin S. Denham, Bend, OR (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/451,115

(22) Filed: Apr. 19, 2012

(65) Prior Publication Data

US 2013/0027229 A1    Jan. 31, 2013

Related U.S. Application Data

(60) Provisional application No. 61/481,965, filed on May 3, 2011.

(51) Int. Cl.
   *H03M 9/00*    (2006.01)

(52) U.S. Cl.
   USPC ........... 341/101; 341/100; 345/540; 345/545; 345/698; 345/469; 345/472; 327/293; 327/157; 327/270; 370/452; 370/460; 370/537; 370/284

(58) Field of Classification Search
   USPC ................. 341/100–101; 345/540, 545, 698, 345/469, 472, 467, 468; 327/293, 157, 158, 327/270; 370/452, 460, 537, 284
   See application file for complete search history.

(56) References Cited

U.S. PATENT DOCUMENTS

| | | | | |
|---|---|---|---|---|
| 5,412,610 | A * | 5/1995 | Suzuki | 365/219 |
| 5,805,089 | A * | 9/1998 | Fiedler et al. | 341/101 |
| 6,031,473 | A * | 2/2000 | Kubinec | 341/100 |
| 6,107,946 | A * | 8/2000 | Jeong | 341/101 |
| 6,377,079 | B1 * | 4/2002 | Fiedler | 326/96 |
| 6,417,790 | B1 * | 7/2002 | Fiedler et al. | 341/101 |
| 6,476,736 | B2 * | 11/2002 | Bartlett | 341/56 |

* cited by examiner

*Primary Examiner* — Lam T Mai

(74) *Attorney, Agent, or Firm* — Lando & Anastasi, LLP

(57) ABSTRACT

A circuit for serializing bits including a clock circuit and a serializer. The clock circuit may be configured to generate a plurality of clock signals from a received master clock signal. A plurality of bits may be transmitted to the serializer in response to a transition of a first clock signal. The serializer may comprise a system of latches and a rotary circuit. The system of latches may be configured to receive a first half of the plurality of bits in response to a first transition of a second clock signal and to receive a second half of the plurality of bits in response to a transition of a third clock signal. The rotary circuit may be configured to receive the plurality of bits from the system of latches and to output each bit at a particular time based on a plurality of rotary clock signals.

33 Claims, 5 Drawing Sheets

METHOD AND APPARATUS FOR SERIALIZING BITS

RELATED APPLICATIONS

The present application claims the benefit of and hereby incorporates by reference U.S. Provisional Application No. 61/481,965 entitled "Apparatus and Method for Serializing Data Using a High Frequency Clock," by Martin S. Denham, filed May 3, 2011.

GOVERNMENT FUNDING

The U.S. Government may have certain rights in this invention as provided for by the terms of Contract No. HR0011-08-C-0115 awarded by the Department of Defense.

TECHNICAL FIELD

This disclosure relates generally to serializers, and more particularly to an apparatus for serializing bits at a high frequency.

BACKGROUND

As digital circuits have grown more complex, so has the size of the chips and boards that house the circuits. Yet, the demand for higher speeds has grown as well, leading to ever increasing clock speeds. The growth in chip size has led to increased difficulty in meeting hold time constraints, and increases in clock speeds has led to increased difficulty in meeting setup time constraints and increased phase distortion problems.

SUMMARY

According to one embodiment, a circuit for serializing bits is provided comprising a clock circuit and a serializer. The clock circuit may be configured to receive a master clock signal and to generate a plurality of clock signals from the master clock signal. A plurality of bits may be transmitted to the serializer in response to a transition of a first clock signal in the plurality of clock signals. The serializer may comprise a system of latches and a rotary circuit. The system of latches may be configured to receive a first half of the plurality of bits in response to a first transition of a second clock signal in the plurality of clock signals and to receive a second half of the plurality of bits in response to a transition of a third clock signal in the plurality of clock signals. The rotary circuit may be configured to receive the plurality of bits from the system of latches and to output each bit at a particular time based on a plurality of rotary clock signals in the plurality of clock signals.

According to another embodiment, a method may begin by generating, by a clock circuit, a plurality of clock signals from a master clock signal. The method may continue by transmitting to a serializer a plurality of bits in response to a transition of a first clock signal in the plurality of clock signals. The method may continue by latching, by the serializer, a first half of the plurality of bits in response to a first transition of a second clock signal in the plurality of clock signals. The method may continue by latching, by the serializer, a second half or the plurality of bits in response to a transition of a third clock signal in the plurality of clock signals. The method may conclude by outputting, by the serializer, each bit of the plurality of bits at a particular time based on a plurality of rotary clock signals in the plurality of clock signals.

According to another embodiment, a circuit for serializing N bits is provided comprising a data source circuit, a serializer circuit, and a clock circuit. The serializer circuit may be communicatively coupled to the data source circuit. The clock circuit may be communicatively coupled to the data source circuit and the serializer circuit. The clock circuit may be configured to receive a master clock signal of M Hertz. The clock circuit may be further configured to generate N serial clock signals, wherein each clock signal has a frequency that is a rational fraction of M Hertz. The N serial clock signals may comprise a first serial clock signal and a second serial clock signal. The second serial clock signal may have an angular separation from the first serial clock signal of $2\pi/N$ radians. The clock circuit may be further configured to generate a data clock signal that has a frequency of the first serial clock signal. The clock circuit may be further configured to generate at least one control signal that has a frequency of the first serial clock signal. The clock circuit may be further configured to transmit the data clock signal to the data source circuit and to transmit the N serial clock signal and that at least one control signal to the serializer circuit. The data source circuit may be configured to transmit N bits to the serializer circuit based on the data clock signal, and the serializer circuit may be configured to output the N bits sequentially based on the N serial clock signals and the at least one control signal.

Technical advantages of certain embodiments of the present disclosure include generating one or more coherent high frequency serial bit streams with stable timing characteristics that are robust to large spatial separation within an integrated circuit. Specifically, the circuit may be very large but still accommodate a high frequency clock and still satisfy setup and hold time constraints with robust immunity to layout variations. Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

Figure 1:
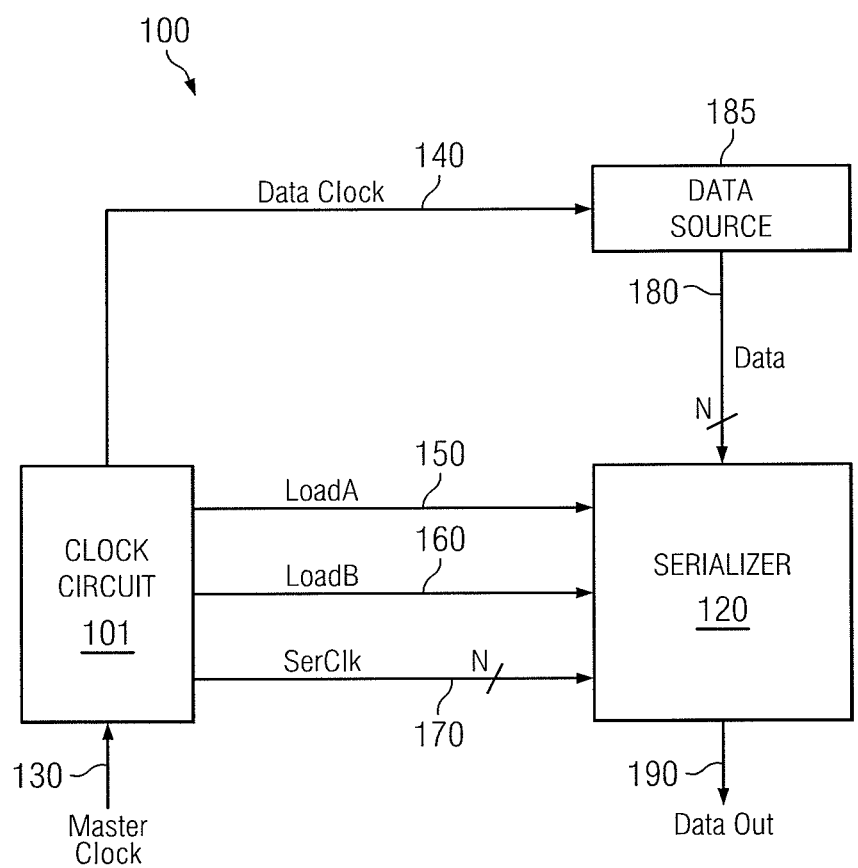
FIG. 1 is a schematic diagram of a circuit for serializing bits at a high frequency.

FIG. 1 is a schematic diagram of a circuit 100 for serializing bits at a high frequency. As provided in FIG. 1, circuit 100 may include a clock circuit 101, a data source 185, and one or more serializers 120. Circuit 100 may be configured to receive a master clock 130 and to serialize the bits in data 180 at a rational fraction $\{X/Y\}$ of the frequency of master clock 130 to produce an output signal, data out 190. As an example, if the master clock 130 is 336 MHz and the $\{X/Y\}$ ratio is 2, then the output serialized data, data out 190 could be 672 megabits per second. Similarly, if {X/Y} was equal to 1, then data out 190 would be 336 megabits per second. Similarly if {X/Y} was 3/2, then data out 190 would be 504 megabits per second. Clock circuit 101 may be configured to receive master clock 130, and to generate, from master clock 130, a plurality of clock signals. Data source 185 may be configured to send data 180 to serializer 120 according to a data clock 140. As an example and not by way of limitation, data source 185 may be an 8b10b encoder. Serializer 120 may be configured to receive and to serialize data 180 according to the plurality of clock signals.

In particular embodiments, clock circuit 101 may be configured to receive master clock 130 and to generate a plurality of clock signals from master clock 130. As an example and not by way of limitation, clock circuit 101 may generate, from master clock 130 a plurality of control signals such as, for example, loadA 150, loadB 160, and a plurality of rotary clock signals, for example serClk 170. In particular embodiments, master clock 130 may be a high frequency clock. As an example and not by way of limitation, master clock 130 may have a frequency of at least 350 MHz. Additionally, clock circuit 101 may generate a data clock 140 to a data source 185. In a particular embodiment, the data source 185 is a synchronous encoder (for example, 8b10b encoder). Data clock 140 may be used as a synchronizing clock for a set of circuits that operate on, transfer, or encode data 180. It is an advantage of certain embodiments, that data clock 140 is generated by clock circuit 101 in conjunction with loadA 150, loadB 160, and serClk 170, so that setup and hold time constraints may be met by data 180 transferring to one or more serializer 120 circuits.

In particular embodiments, clock circuit 101 may be located a great distance across a chip from serializer 120. In such instances, transmitting a high frequency clock signal across the chip may introduce considerable phase distortions into the signal. To minimize the phase distortions introduced while transmitting a clock signal across the chip, clock circuit 101 may use master clock 130 to generate a plurality of low frequency clock signals that are transmitted across circuit 100. In a particular embodiment, data clock 140 has a frequency of {X/Y}*{1/N} of master clock 130, where N is the number of bits encoded by data source 185. As another example and not by way of limitation, each rising edge and its corresponding falling edge of loadA 150 and loadB 160 may be inset between a rising edge of data clock 140 and the next rising edge of data clock 140, such that the frequency of loadA 150 and loadB 160 is at most the frequency of data clock 140. LoadA 150 and loadB 160 may be out of phase with each other. As yet another example and not by way of limitation, SerClk 170 may include a plurality of rotary clock signals. For a quantity {N} SerClk 170 signals, {N} corresponding to {N} bits in data 180, the frequency of the signals is {X/Y}*{1/N} that of master clock 130. Furthermore, the serClk 170 signals transition sequentially (that is, serClk[0] transitions, followed by serClk[1], and so on, until serClk[N−1], and then wraps back around to serClk[0]). Moreover, the transitions may be evenly spaced apart, in phase, such that the angular separation is 2π/N radians apart See FIGS. 4 and 5 for example rotary clock signals. In particular embodiments, each rotary clock signal may have a frequency of {X/Y}*1/N of the frequency of master clock 130, where N is the number of rotary clock signals in the plurality of rotary clock signals. Each rotary clock signal may be out of phase with another rotary clock signal, such as for example the next rotary clock signal, in the plurality of rotary clock signals by {Y/X} * the clock period of master clock 130. In particular embodiments, the plurality of rotary clock signals may be used to serialize a plurality of bits at a high frequency.

In particular embodiments, serializer 120 may be configured to receive data 180, loadA 150, loadB 160, and SerClk 170, and to generate data out 190. Data 180 may include N bits. In particular embodiments, serializer 120 may be configured to receive a first half of data 180 on a rising edge of loadA 150 and a second half of data 180 on a rising edge of loadB 160, and to use serClk 170 to serialize the bits of data 180 at {X/Y} of the frequency of master clock 130 to produce data out 190. In this manner, circuit 100 may serialize bits at the frequency of {X/Y} of master clock 130 while using low frequency clock signals.

In operation, circuit 100 may serialize an N-bit data signal 180 using a high frequency clock operating at M Hertz and mitigating phase distortions that would otherwise be caused by transmitting a high-frequency clock. Specifically, because circuit 100 may output each bit on a falling edge of each of the N rotary clock signals, each rotary clock signal having a frequency of XM/(YN) Hertz and each generating a falling edge {YN/XM} seconds before another rotary clock signal generates a falling edge, circuit 100 may serialize N bits at {XM/Y} bits per second and minimize the noise and phase distortions introduced into clock signals as they are pushed across circuit 100. Furthermore, data clock 140, loadA 150, and loadB 160 may also operate at frequencies substantially lower than the frequency of master clock 130. Therefore, clock circuit 101 may be located a great distance from serializer 120 on a chip, but serializer 120 may still serialize bits at the frequency of master clock 130 while introducing minimal noise and phase distortions.

Figure 2:
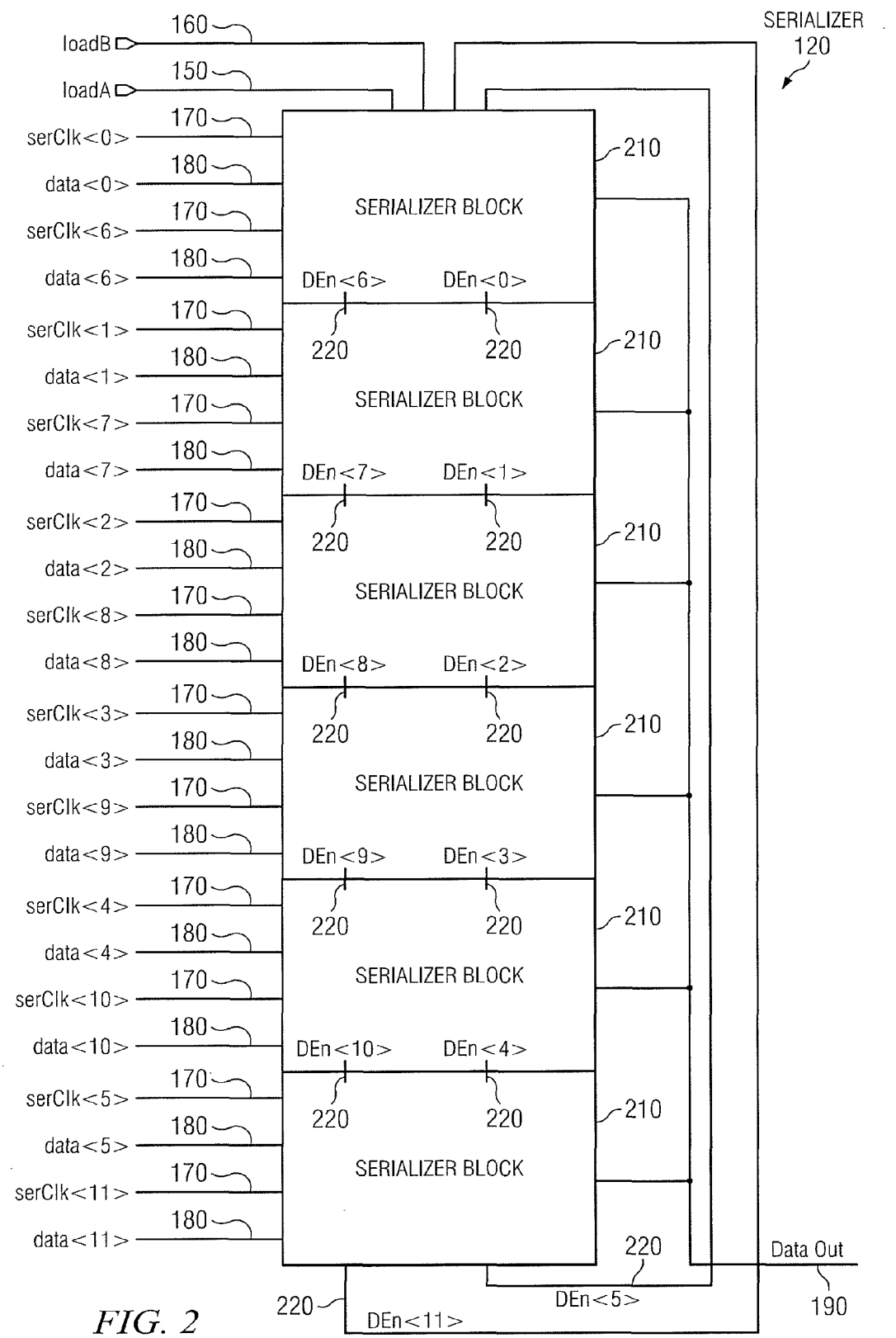
FIG. 2 is an illustration of some of the logical components of the serializer in the circuit of FIG. 1.
Figure 3:
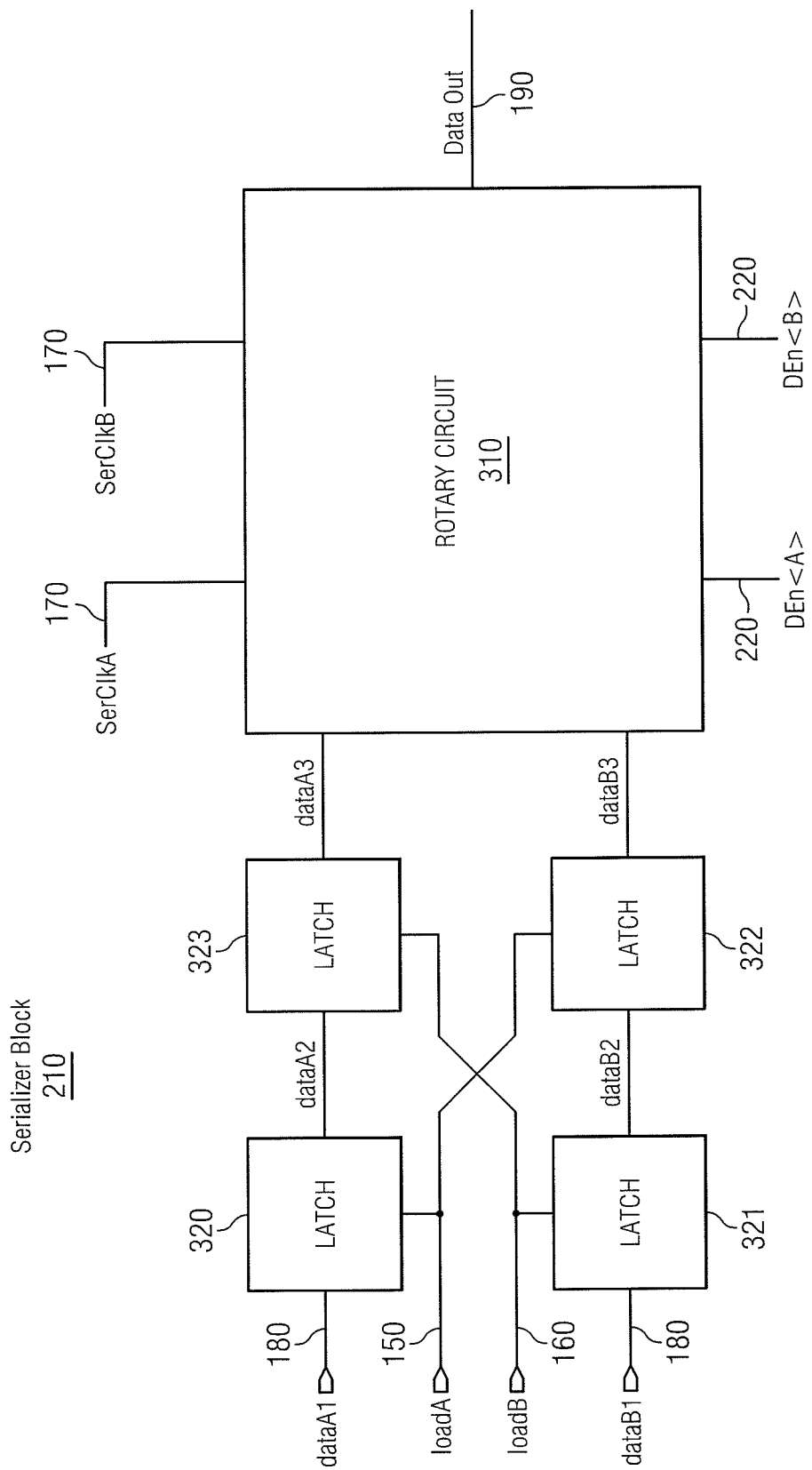
FIG. 3 is an illustration of some of the logical components of the serializer block in the serializer of FIG. 2.
Figure 4:
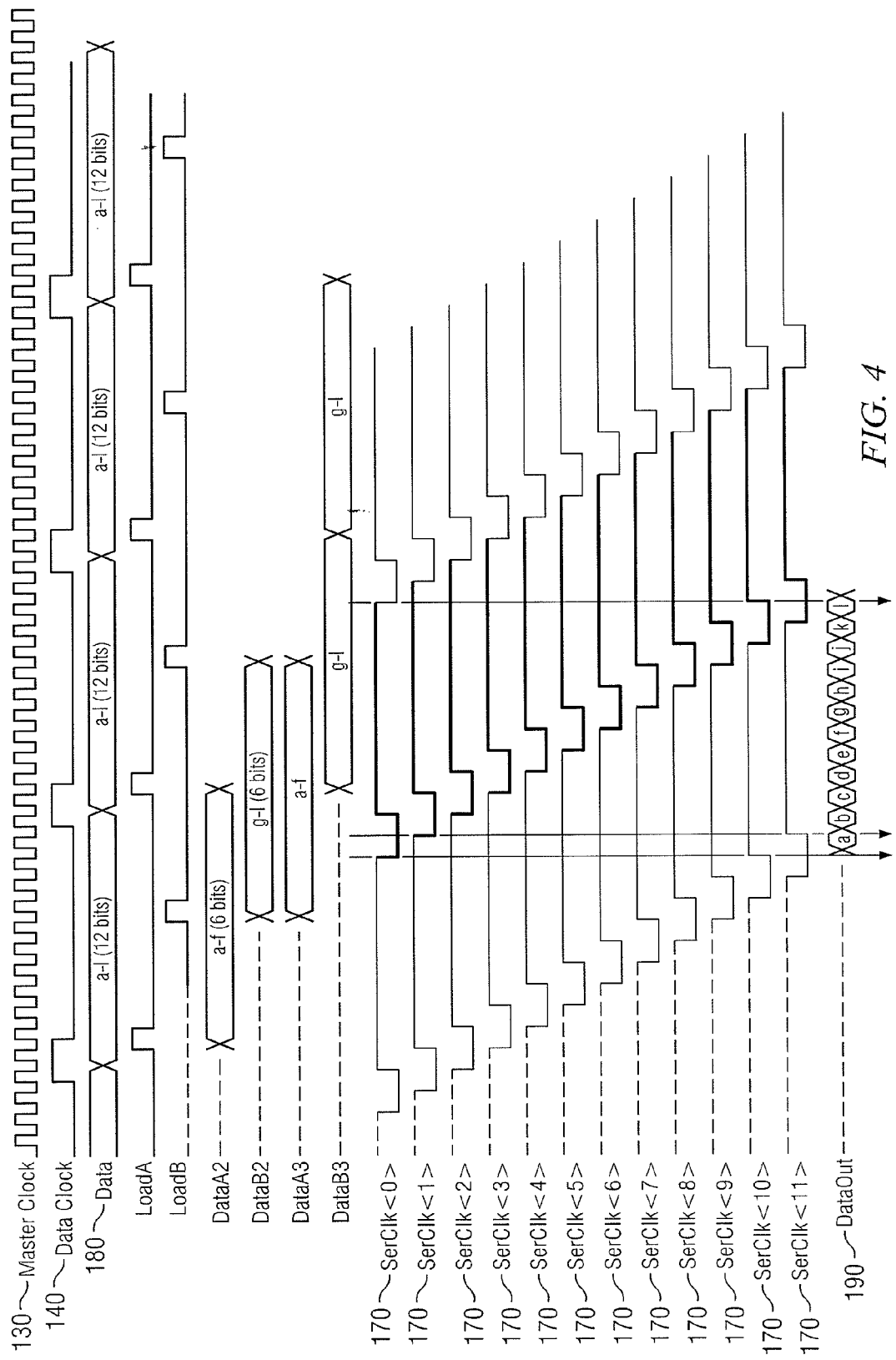
FIG. 4 is a timing diagram illustrating the dataflow of the circuit of FIG. 1.
Figure 5:
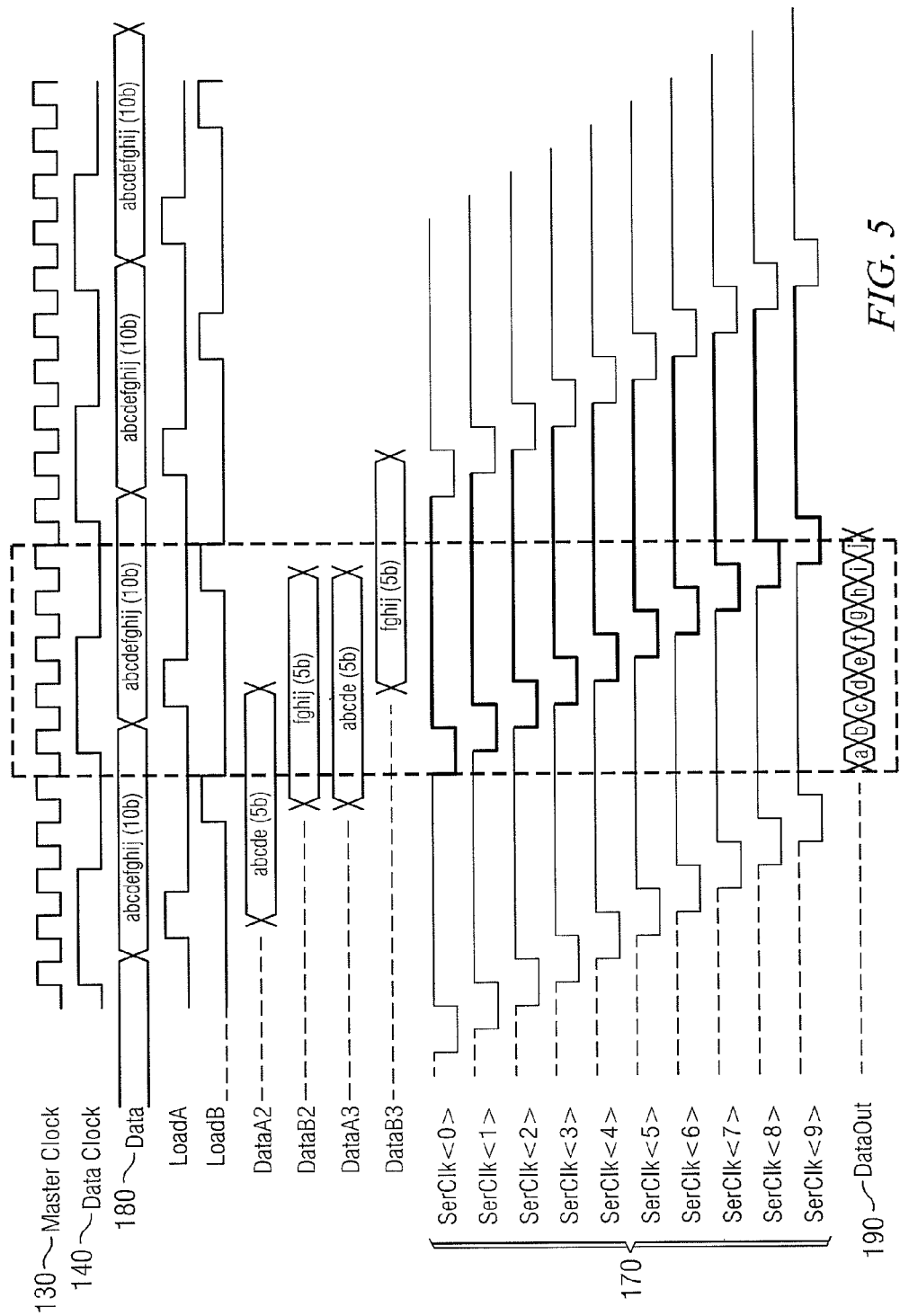
FIG. 5 is a timing diagram illustrating the dataflow of the circuit of FIG. 1.

FIGS. 2-5 illustrate some of the components as well as the operation of circuit 100. FIG. 2 illustrates some of the logical components of serializer 120. FIG. 3 illustrates some of the logical components of the serializer block in serializer 120. FIGS. 4-5 illustrates the timing of the dataflow of circuit 100.

In general, serClk 170 signals are a {XM/YN} harmonic of master clock 130 and that serial output 190 is created by serClk 170. As each new activating edge of serClk 170 is realized, a previous bit transmission is completed and a new bit is promoted to serial output 190. FIGS. 2-3 illustrate a particular embodiment of the invention, but it should be obvious to those skilled in the art that the claimed invention includes many embodiments that can perform the method of the invention.

FIG. 2 is an illustration of some of the logical components of serializer 120 in circuit 100 of FIG. 1. The serializer embodiment in FIG. 2 was designed to be low-latency and high-speed, using a ping-pong latch configuration and tri-state output. However, there are many logical reductions that may be used to create the serializer of the invention. For example, a simple combinatorial gate reduction may be used. As provided in FIG. 2, serializer 120 may include a plurality of serializer blocks 210. Each serializer block 210 may be configured to receive loadA 150 and loadB 160. The plurality of serializer blocks 210 may be configured to serialize the bits of data 180 to generate data out 190. In particular embodiments, each serializer block 210 may be configured to receive a plurality of rotary clock signals, for example serClk 170, and a plurality of bits of data 180. Each bit of data 180 may correspond with a rotary clock signal in the plurality of rotary clock signals. A serializer block 210 may be configured to output a bit of data 180 on a falling edge of the rotary clock signal corresponding to the bit. In one embodiment, each serializer block 210 may receive two bits of data 180 (π radians and N/2 edges apart) and two corresponding rotary clock signals (also π radians and N/2 edges apart). In this manner, output delay performance may be enhanced for this specific embodiment. Each serializer block 210 may be configured to serialize the two bits of data 180 that it receives to produce an output signal, data out 190, according to the falling edges of the two corresponding rotary clock signals. In particular embodiments, each serializer block 210 may be configured to receive a bit from the first half of data 180 and a bit from the second half of data 180.

As an example and not by way of limitation, if data 180 includes twelve bits, then serializer 120 may include six serializer blocks 210, each serializer block 210 receiving two bits of data 180 and two corresponding rotary clock signals from serClk 170. One bit may be from the first half of data 180 and the other bit may be from the second half of data 180. For example, the first serializer block 210 may receive the first bit of data 180, data<0>, and the seventh bit of data 180, data<6>. The first serializer block may also receive the corresponding rotary clock signals serClk<0> and serClk<6>. The plurality of serializer blocks 210 may be configured to output the twelve bits of data 180 in a serialized manner to produce data out 190.

In particular embodiments, serializer 120 transmits the bits of data 180 in a rotary fashion. In other words, if data 180 is an N-bit data signal, when serializer 120 receives bit K, serializer 120 may disable bit K−1 on Data Out 190 and enable bit K on Data Out 190. DEn signals 220 may be used to disable the previous bit. As an example and not by way of limitation, after data<5> arrives at a serializer block 210, DEn<4> may assert to disable data<4> from being transmitted on Data Out line 190. Then, when data<6> arrives at a serializer block 210, DEn<5> may assert to disable data<5> from being transmitted on Data Out line 190. Then, when the first bit of the next data 180 signal (the next data<0>) arrives, DEn<11> can assert to disable data<11> of the previous data 180 signal. In this manner, serializer 120 transmits each bit of each successive data 180 signal in a rotary fashion on Data Out 190.

FIG. 3 is an illustration of some of the logical components of serializer block 210 in serializer 120 of FIG. 2. As provided in FIG. 3, serializer block 210 may include latches 320, 321, 322, and 323 and a rotary circuit 310. Latches 320, 321, 322, and 323 may be configured to latch the bits of data 180. Rotary circuit 310 may be configured to receive the output from latches 322 and 323 and to generate data out 190 from the output of latches 322 and 323.

In particular embodiments, latches 320, 321, 322, and 323 may be configured to latch the bits of data 180. The bits of data 180 may be sent through latches 320, 321, 322, and 323 in order to satisfy hold time constraints. As an example and not by way of limitation, the system of latches may include two latches 320 and 323. Latch 320 may be configured to receive a bit of data 180, dataA1, in response to loadA 150 being high. Latch 323 may be configured to receive the output of the first latch 320, dataA2, in response to loadB 160 being high. In this manner, the bit of data 180 may be held in a series of latches 320 and 323 before it is serialized in order to satisfy hold time constraints.

In particular embodiments, serializer block 210 may include rotary circuit 310. Rotary circuit 310 may be configured to receive the outputs from latches 322 and 323. Rotary circuit 310 may be configured to receive dataA3 from latch 323. In particular embodiments, rotary circuit 310 may be further configured to receive a rotary clock signal, such as, for example, serClkA 170 and a disable signal, such as, for example, DEn<A> 220. Rotary circuit 310 may be configured to output dataA3 on a rising edge of SerClkA 170, and may disable dataA3 from the output on a rising edge of DEn<A> 220.

In particular embodiments, serializer block 210 may be configured to serialize more than one bit of data 180 to generate data out 190. As an example and not by way of limitation, serializer block 210 may serialize two bits that are π radians or N/2 bits apart. Serializer 120 may include four latches 320, 321, 322, and 323. Each pair of latches 320/323 and 321/322 may be configured to latch one bit in data 180. The first latch 320 may latch a first bit dataA1 in response to loadA 150 being high. The second latch 323 may latch the output of the first latch 320, dataA2, in response to loadB 160 being high. Also in response to loadB 160 being high, a third latch 321 may latch a second bit dataB1. Then in response to the subsequent occurrence of loadA 150 being high, a fourth latch 322 may latch the output of the third latch 321, dataB2. Rotary circuit 310 may be configured to receive and to output the output from the second latch 323, dataA3, on a rising edge of serClkA 170. Then on a rising edge of serClkB 170, rotary clock circuit 310 may receive and output the output from the fourth latch 322, dataB3. In this manner, rotary circuit 310 may output both bits in a serialized fashion to generate data out 190.

Several serializer blocks 210 may be configured in a manner (such as, for example, the configuration of FIG. 2) such that a series of bits may be serialized by circuit 100. For example, each serializer block 210 may be configured to serialize two bits that are "180 degrees out of phase" with one another (e.g., first serializer block 210 serializes bit 0 and bit 6 of a 12-bit sequence). By configuring each serializer block 210 to serialize bits that are 180 degrees out of phase with each other, circuit 100 may operate a lower frequency thus satisfying hold time constraints and minimizing phase distortions.

FIG. 4 is a timing diagram illustrating the data flow of the circuit of FIG. 1. As provided in FIG. 4, circuit 100 may be driven by master clock 130. Circuit 100 may generate data clock 140 from master clock 130. In particular embodiments, data clock 140 may have a frequency substantially below the frequency of master clock 130. As an example and not by way of limitation, the serializer ratio of {X/Y} is 1 and thus, data clock 140 may have a frequency of {1/N} the frequency of master clock 130. Circuit 100 may further be configured to generate from master clock 130 loadA 150 and loadB 160. In particular embodiments, loadA 150 and loadB 160 may be out of phase with one another, and each rising edge and its corresponding falling edge of loadA 150 and loadB 160 may be inset between a rising edge of data clock 140 and the next rising edge of data clock 140. In particular embodiments, the edges of loadA 150 are inset within the first N/2 transitions of SerClk 170 by at least ½ clock period of Master Clock 130. Similarly, the edges of loadB 160 are inset within the second N/2 transitions of SerClk 170 by at least ½ clock period of Master Clock 130.

In particular embodiments, circuit 100 may be configured to serialize data 180. Circuit 100 may begin serializing data 180 by loading, for example, into serializer blocks 210 of serializer 120, the first half of data 180 on a rising edge of loadA 150. Circuit 100 may then load the second half of data 180 on a rising edge of loadB 160. As an example and not by way of limitation, data 180 may include twelve bits. On a rising edge of loadA 150, circuit 100 may load the first six bits of data 180 to form dataA2. On a rising edge of loadB 160, circuit 100 may load the second six bits of data 180 to form dataB2. On the rising edge of loadB 160, circuit 100 may push dataA2 through the system of latches to generate dataA3. On a subsequent rising edge of loadA 150, circuit 100 may push dataB2 through the system of latches to generate dataB3.

After dataA3 has been generated, circuit 100 may begin serializing the first half of data 180. In particular embodiments, circuit 100 may serialize the first half of data 180 using a plurality of rotary clock signals, for example, serClk 170. After serializing the first half of data 180, circuit 100 may serialize the second half of data 180 using the plurality of rotary clock signals. In particular embodiments, each rotary clock signal in the plurality of rotary clock signals 170 may be out of phase with the other rotary clock signals 170 in the plurality of rotary clock signals 170. In some embodiments, each rotary clock signal 170 may be out of phase with another rotary clock signal 170 in the plurality of rotary clock signals 170 by one clock period of master clock 130.

As an example and not by way of limitation, if data 180 includes twelve bits, serClk<0> 170 through serClk<5> 170 may be used to serialize the first half of data 180. SerClk<6> 170 through serClk<11> 170 may be used to serialize the second half of data 180. Each bit of data 180 may be outputted on a falling edge of its corresponding rotary clock signal. For example, data<0> may be outputted on a falling edge of serClk<0>, data<1> may be outputted on a falling edge of serClk<1>, and so on. SerClk<0> 170 may be out of phase with serClk<1> 170 by one period of master clock 130, serClk<1> 170 may be out of phase with serClk<2> 170 by one period of master clock 130, and so on. In this manner, circuit 100 may serialize the bits of data 180 at the frequency of master clock 130 to generate data out 190 without pushing master clock 130 across a chip. Instead, circuit 100 may push clock signals with frequencies substantially lower than the frequency of master clock 130, which will reduce the phase distortion introduced into the clock signals as they are transmitted across circuit 100.

One of ordinary skill in the art will appreciate that by modifying the number of serializer blocks 210 and the timing of particular clock signals, circuit 100 can serialize any number of bits of data 180. For example, FIG. 5 is a timing diagram illustrating the dataflow of the circuit 100 of FIG. 1. As provided by FIG. 5, circuit 100 may be modified to serialize 10 bits. As an example and not by way of limitation, circuit 100 may serialize 10 bits received from an 8b10b encoder. Moreover, circuit 100 may be modified to transmit a bit of data 180 on every rising and falling edge of master clock 130 (i.e. double rate), thus {X/Y} is equal to 2.

Although the present disclosure describes circuit 100 transmitting and receiving signals in response to rising and/or falling edges of clock signals, this disclosure contemplates circuit 100 transmitting and receiving signals in response to any suitable transition of clock signals, such as for example, rising edges, falling edges, high signals, low signals, or any other signaling behavior of the clock signals. Furthermore, although this disclosure describes circuit 100 transmitting and receiving signals "on" rising and/or falling edges of clock signals, this disclosure contemplates circuit 100 transmitting and receiving signals in response to a rising and/or falling edge of a clock signal shortly after the rising and/or falling edge due to delays in elements of circuit 100. Furthermore, although this disclosure describes latches latching data in response to clock signals being a particular level, such as for example, high, this disclosure contemplates latches latching data in response to the clock signals being any appropriate transition, such as for example, rising edges, falling edges, high signals, low signals, or any other signaling behavior of the clock signals. Although this disclosure describes latches performing particular functions of the circuit, this disclosure contemplates any appropriate circuit element performing the particular functions of the circuit, such as for example flip-flops and registers. Although the present disclosure illustrates signals including pulse components of particular widths, this disclosure contemplates signals including pulse components of any suitable width. As an example and not by way of limitation, the serClk 170 signals may have 50/50 duty cycles. This disclosure further contemplates circuit 100 being formed using combinatorial logic circuit elements and/or tri-state logic circuit elements.

Although the present disclosure includes several embodiments, changes, substitutions, variations, alterations, transformations, and modifications may be suggested to one skilled in the art, and it is intended that the present disclosure encompass such changes, substitutions, variations, alterations, transformations, and modifications as fall within the spirit and scope of the appended claims.

What is claimed is:

1. A circuit for serializing a plurality of bits comprising:
   a clock circuit configured to receive a master clock signal and to generate a plurality of clock signals from the master clock signal, the plurality of clock signals comprising:
      a first clock signal having a frequency substantially below the frequency of the master clock signal,
      a second and third clock signals, the second clock signal out of phase with the third clock signal, wherein a rising edge and its corresponding falling edge of the second and third clock signals are inset between the rising edge of the first clock signal and the next rising edge of the first clock signal, and
      a plurality of rotary clock signals, each rotary clock signal out of phase with the other rotary clock signals in the plurality of rotary clock signals; and
   a serializer, wherein the plurality of bits is transmitted to the serializer in response to a transition of the first clock signal, the serializer comprising:
      a first latch configured to receive a bit from the plurality of bits in response to a first transition of the second clock signal,
      a second latch coupled to the output of the first latch and configured to receive the output of the first latch in response to a transition of the third clock signal,
      a third latch configured to receive a second bit from the plurality of bits in response to the transition of the third clock signal;
      a fourth latch coupled to the output of the third latch and configured to receive the output of the third latch in response to a second transition of the second clock signal; and
      a rotary circuit coupled to the outputs of the second and fourth latches, the rotary circuit configured to output, in response to a transition of a rotary clock signal in the plurality of rotary clock signals, the bit from the plurality of bits, and the rotary circuit further configured to output, in response to a transition of a second rotary clock signal in the plurality of rotary clock signals, the second bit from the plurality of bits,
      wherein the second rotary clock signal generates a rising edge at least one period of the master clock signal after the rotary clock signal generates a rising edge.

2. A circuit for serializing a plurality of bits comprising:
   a clock circuit configured to receive a master clock signal and to generate a plurality of clock signals from the master clock signal; and
   a serializer, wherein the plurality of bits is transmitted to the serializer in response to a transition of a first clock signal in the plurality of clock signals, the serializer comprising:

a system of latches configured to receive a first half of the plurality of bits in response to a transition of a second clock signal in the plurality of clock signals and to receive a second half of the plurality of bits in response to a transition of a third clock signal in the plurality of clock signals; and a rotary circuit configured to receive the plurality of bits from the system of latches and to output each bit at a particular time based on a plurality of rotary clock signals in the plurality of clock signals.

3. The circuit of claim 2, wherein a rising edge and its corresponding falling edge of the second and third clock signals are inset between a rising edge of the first clock signal and the next rising edge of the first clock signal.

4. The circuit of claim 2, wherein the second clock signal is out of phase with the third clock signal.

5. The circuit of claim 2, wherein each rotary clock signal is out of phase with the other rotary clock signals in the plurality of rotary clock signals.

6. The circuit of claim 2, wherein the first clock signal has a frequency substantially lower than the frequency of the master clock signal.

7. The circuit of claim 2, the first clock signal has a frequency of at most half the frequency of the master clock signal.

8. The circuit of claim 2, wherein the master clock signal has a frequency of at least 350 MHz.

9. The circuit of claim 2, wherein the clock circuit generates one rotary clock signal for each bit in the plurality of bits.

10. The circuit of claim 2, the rotary circuit further configured to output a first bit in the plurality of bits, to disable the first bit from being outputted in response to receiving a subsequent bit in the plurality of bits, and to output the subsequent bit in response to receiving the subsequent bit.

11. The circuit of claim 2, wherein each rotary clock signal is out of phase with another rotary clock signal in the plurality of rotary clock signals by one clock period of the master clock signal.

12. The circuit of claim 2, wherein the master clock signal having a frequency of M Hertz, the plurality of bits comprising N bits, the plurality of rotary clock signals comprising N rotary clock signals, each rotary clock signal having a frequency of M/N Hertz, each rotary clock signal generating a rising edge 1/M seconds before another rotary clock signal generates a rising edge.

13. The circuit of claim 2, wherein the system of latches comprises:
a first latch configured to receive a bit from the plurality of bits in response to the transition of the second clock signal, and
a second latch coupled to the output of the first latch and configured to receive the output of the first latch in response to the transition of the third clock signal.

14. The circuit of claim 13, wherein the system of latches further comprises:
a third latch configured to receive a second bit from the plurality of bits in response to the transition of the third clock signal, and
a fourth latch coupled to the output of the third latch and configured to receive the output of the third latch in response to a second transition of the second clock signal.

15. A method comprising:
generating, by a clock circuit, a plurality of clock signals from a master clock signal;

transmitting to a serializer a plurality of bits in response to a transition of a first clock signal in the plurality of clock signals;
latching, by the serializer, a first half of the plurality of bits in response to a transition of a second clock signal in the plurality of clock signals;
latching, by the serializer, a second half of the plurality of bits in response to a transition of a third clock signal in the plurality of clock signals; and
outputting, by the serializer, each bit of the plurality of bits at a particular time based on a plurality of rotary clock signals in the plurality of clock signals.

16. The method of claim 15, wherein a rising edge and its corresponding falling edge of the second and third clock signals are inset between a rising edge of the first clock signal and the next rising edge of the first clock signal.

17. The method of claim 15, wherein generating the plurality of clock signals comprises generating the second clock signal out of phase with the third clock signal.

18. The method of claim 15, wherein generating the plurality of clock signals comprises generating each rotary clock signal out of phase with the other rotary clock signals in the plurality of rotary clock signals.

19. The method of claim 15, wherein generating the plurality of clock signals comprises generating the first clock signal with a frequency substantially lower than the frequency of the master clock signal.

20. The method of claim 15, wherein generating the plurality of clock signals comprises generating the first clock signal with a frequency of at most half the frequency of the master clock signal.

21. The method of claim 15, wherein the master clock signal has a frequency of at least 350 MHz.

22. The method of claim 15, wherein generating the plurality of clock signals comprises generating one rotary clock signal for each bit in the plurality of bits.

23. The method of claim 15, wherein the outputting each bit of the plurality of bits comprises:
outputting, by the serializer, a first bit in the plurality of bits;
receiving, by the serializer, a subsequent bit in the plurality of bits;
disabling, by the serializer, the first bit from being outputted in response to receiving the subsequent bit; and
outputting, by the serializer, the subsequent bit in response to receiving the subsequent bit.

24. The method of claim 15, wherein each rotary clock signal is out of phase with another rotary clock signal in the plurality of rotary clock signals by one clock period of the master clock signal.

25. The method of claim 15, wherein the master clock signal has a frequency of M Hertz, wherein the plurality of bits comprise N bits, wherein the plurality of rotary clock signals comprise N rotary clock signals, each rotary clock signal having a frequency of M/N Hertz, each rotary clock signal generating a rising edge 1/M seconds before another rotary clock signal generates a rising edge.

26. The method of claim 15, wherein the serializer comprises:
a first latch configured to receive a bit from the plurality of bits in response to the transition of the second clock signal, and
a second latch coupled to the output of the first latch and configured to receive the output of the first latch in response to the transition of the third clock signal.

27. The method of claim 26, wherein the serializer further comprises:

a third latch configured to receive a second bit from the plurality of bits in response to the transition of the third clock signal, and a fourth latch coupled to the output of the third latch and configured to receive the output of the third latch in response to a second transition of the second clock signal.

28. A circuit for serializing N bits comprising:

a data source circuit;

a serializer circuit communicatively coupled to the data source circuit; and a clock circuit communicatively coupled to the data source circuit and the serializer circuit, and configured to:

receive a master clock signal of M Hertz;

generate N serial clock signals, wherein each serial clock signal has a frequency that is a rational fraction of M Hertz, the N serial clock signals comprising:
a first serial clock signal; and
a second serial clock signal with an angular separation from the first serial clock signal of $2\pi/N$ radians;

generate a data clock signal that has a frequency of the first serial clock signal;

generate at least one control signal that has a frequency of the first serial clock signal;

transmit the data clock signal to the data source circuit; and transmit the N serial clock signals and the at least one control signal to the serializer circuit;

wherein the data source circuit is configured to transmit N bits to the serializer circuit based on the data clock signal; and wherein the serializer circuit is configured to output the N bits sequentially based on the N serial clock signals and the at least one control signal.

29. The circuit of claim 28, wherein the rising and falling edges of one period of the at least one control signal are inset between a rising edge of the data clock signal and the next rising edge of the data clock signal.

30. The circuit of claim 28, wherein the data source circuit is further configured to transmit N/2 bits to the serializer circuit during one period of the data clock signal.

31. The circuit of claim 28, wherein each of the N serial clock signals corresponds to a bit from the N bits.

32. The circuit of claim 28, wherein each of the N serial clock signals are out of phase with the other N serial clock signals.

33. The circuit of claim 28, wherein the rational fraction is X/(YN), wherein the value of X/Y is a rational number.

* * * * *